United States Patent
Jenne

(10) Patent No.: US 8,513,753 B1
(45) Date of Patent: Aug. 20, 2013

(54) PHOTODIODE HAVING A BURIED WELL REGION

(75) Inventor: Fredrick B. Jenne, Los Gatos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 669 days.

(21) Appl. No.: 11/097,665

(22) Filed: Apr. 1, 2005

Related U.S. Application Data

(60) Provisional application No. 60/609,636, filed on Sep. 14, 2004.

(51) Int. Cl.
 *H01L 31/0352* (2006.01)
(52) U.S. Cl.
 USPC .................................. 257/431; 257/E31.054
(58) Field of Classification Search
 USPC ................. 257/431–432, 435–436, 443–444, 257/222, E31.054
 See application file for complete search history.

(56) References Cited

U.S. PATENT DOCUMENTS

| | | | |
|---|---|---|---|
| 5,191,399 A * | 3/1993 | Maegawa et al. | 257/223 |
| 5,514,887 A * | 5/1996 | Hokari | 257/222 |
| 5,625,210 A | 4/1997 | Lee et al. | |
| 5,936,270 A * | 8/1999 | Kamada | 257/291 |
| 6,225,670 B1 | 5/2001 | Dierickx | |
| 6,713,796 B1 * | 3/2004 | Fox | 257/292 |
| 7,110,028 B1 * | 9/2006 | Merrill | 348/294 |
| 7,247,899 B2 * | 7/2007 | Kuwabara et al. | 257/293 |
| 7,253,019 B2 * | 8/2007 | Dierickx | 438/60 |
| 2001/0006237 A1 * | 7/2001 | Abe | 257/215 |
| 2002/0167030 A1 * | 11/2002 | Miida | 257/215 |
| 2006/0105489 A1 * | 5/2006 | Rhodes | 438/48 |

* cited by examiner

*Primary Examiner* — Colleen Matthews

(57) ABSTRACT

A photodiode pixel sensor is provided having a buried region of opposite conductivity type than a semiconductor substrate in which the sensor is formed. The photodiode pixel sensor further includes a well region arranged upon and in contact with an upper surface of the buried region and a collection-junction extending into the well region. The well region and collection-junction are of the same conductivity type as the buried region and include greater net concentrations of dopants than the buried region and the well region, respectively. Such a configuration creates a drift field to channel (i.e., funnel) charge to the collection-junction. In some cases, the collection-junction may be a drain region of a transistor spaced above the buried region. An imaging device is also provided which includes at least two adjacent photodiode pixel sensors each including the aforementioned architecture isolated from each other by a distance less than approximately 2.0 microns.

22 Claims, 2 Drawing Sheets

PHOTODIODE HAVING A BURIED WELL REGION

PRIORITY APPLICATION

The present application claims priority to provisional application No. 60/609,636 entitled "Funnel Photodiode" filed Sep. 14, 2004.

BACKGROUND OF THE INVENTION

1. Field of the Invention

The present invention relates generally to semiconductor based photon detectors and, more specifically, to photodiode pixel sensors.

2. Description of the Related Art

The following descriptions and examples are given as background information only.

Sensors used for detecting electromagnetic radiation (a.k.a., photons) are generally referred to as pixel sensors and are widely fabricated within semiconductor-based materials for applications including but not limited to optical pointing devices and imaging arrays. Semiconductor based pixel sensors commonly employ photodiodes as sensing elements and, in some cases, include a number of active semiconductor devices, such as transistors, to amplify the charge that is collected in a light sensitive element or region in the photodiode. The inclusion of such active devices, however, may undesirably increase the size of a pixel and reduce the collection efficiency of the photodiode. In addition, conventional pixel sensors may be limited in their collection efficiency and accuracy by their architecture, regardless of whether active devices are included. In particular, some conventional photodiode pixel sensor architectures are susceptible to having photon-generated electrons recombine within the semiconductor substrate before being collected by the photodiode. In addition, some conventional photodiode pixel sensor architectures lack sufficient isolation between adjacent pixels, allowing electrons generated in one pixel to be collected in the photodiode of an adjacent pixel. As a consequence, the pixel in which the electrons are generated may experience image loss.

Moreover, some conventional photodiode pixel sensor architectures are susceptible to dark current, which is leakage current collected by the diode when there is no light falling on the detector. Dark current undesirably promotes obscure images with shadows and/or with a "snowy" appearance such as one may see when viewing a bad television transmission and, therefore, is preferably minimized. Dark current is in part due to surface generation leakage current as well as the generation of carriers in the depletion region of a diode in the absence of light. In some conventional photodiode pixel sensor architectures, the depletion region of the diode may be in close proximity to the surface and, therefore, the generation of carriers at the surface may substantially increase the generation of carriers in the depletion region, resulting in increased dark current.

Accordingly, it would be advantageous to develop a photodiode pixel sensor that substantially reduces dark current as well as reduces the recombination and loss of carrier charge due to scattering of electrons. In particular, it would be beneficial to develop a photodiode pixel sensor having the photodiode separated from a pixel sensor surface to reduce dark current. In addition, it would be desirable for the photodiode pixel sensor to have an architecture that increases collection efficiency of photons, particularly those generated deep within the substrate. Furthermore, it would be beneficial to develop an imaging device having improved isolation between adjacent pixels to substantially eliminate cross-collection of electrons between adjacent pixels, thereby reducing resultant image loss. Finally, it would be advantageous to be able to incorporate active semiconductor devices over a photodiode to amplify the collected carrier charge without increasing the size of a pixel to thereby increase the collection efficiency of the pixel.

SUMMARY OF THE INVENTION

The problems outlined above may be in large part addressed by a photodiode pixel sensor having a buried region of opposite conductivity type than a semiconductor substrate in which the sensor is formed. The following are mere exemplary embodiments of the photodiode pixel sensor and an imaging device including a plurality of pixel sensors. The following exemplary embodiments are not to be construed in any way to limit the subject matter of the claims.

One embodiment of the photodiode pixel sensor includes a well region arranged upon and in contact with an upper surface of the buried region and a collection-junction extending into the well region. The well region and collection-junction are of the same conductivity type as the buried region. In addition, the well region includes a net concentration of dopants greater than a net concentration of dopants within the buried region and the collection-junction includes a net concentration of dopants greater than the net concentration of dopants within the well region.

Another embodiment of the photodiode pixel sensor includes a transistor comprising a drain region of a first conductivity type and a well region of the first conductivity type extending from a lower surface of the drain region through a barrier material of a second conductivity type opposite from the first conductivity type. The buried region in such a case is of the first conductivity type and is arranged in contact with a lower surface of the well region and is spaced directly below at least a portion of the transistor by the barrier material.

An embodiment of the imaging device includes at least two adjacent photodiode pixel sensors each including a buried region of opposite conductivity type than the semiconductor substrate in which the photodiode pixel sensors are formed. The buried regions of the at least two adjacent photodiode pixel sensors are isolated from each other by a distance less than approximately 2.0 microns.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
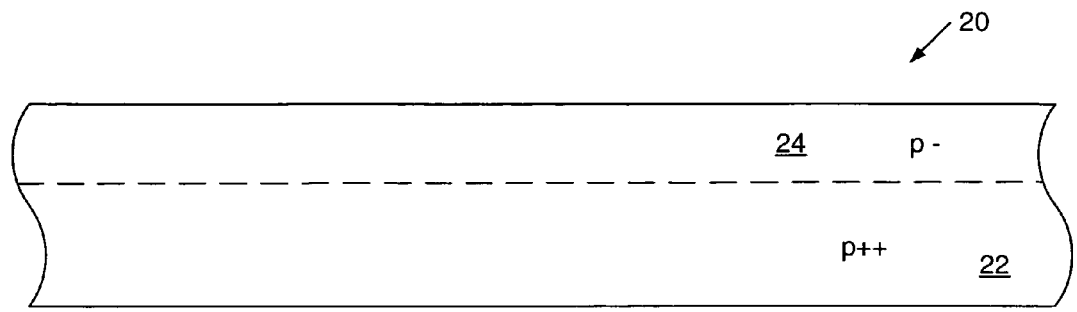
FIG. 1 is a partial cross-sectional view of an exemplary semiconductor substrate used for the subsequent formation of a pixel sensor.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary method is provided for forming an exemplary photodiode pixel sensor with a buried region of opposite conductivity type than a semiconductor substrate in which the photodiode is formed. As will be described in more detail below, such a photodiode pixel sensor architecture may advantageously reduce dark current as well as reduce the recombination and loss of photon generated carrier charge due to scattering of electrons. As a result, the photodiode pixel sensor described herein may have higher photon collection efficiency and improved image clarity as compared to conventional photodiode pixel sensors. Furthermore, the photodiode pixel sensor architecture described herein may incorporate active semiconductor devices without increasing the size of the pixel and/or hindering the collection efficiency of the photodiode relative to conventional photodiode pixel sensors.

FIG. 1 illustrates an exemplary semiconductor topography which may be used for the fabrication process of the photodiode pixel sensor. In particular, FIG. 1 illustrates semiconductor substrate 20 including regions having distinct net concentrations of dopants. In some embodiments, semiconductor substrate 20 may include lower region 22 having a higher net concentration of p-type dopants than upper region 24 as shown in FIG. 1. Alternatively, semiconductor substrate 20 may include regions having distinct net concentrations of n-type dopants. In yet other embodiments, semiconductor substrate 20 may not include regions of having distinct net concentrations of dopants and may either be doped with a substantially uniform concentration of p-type or n-type dopants, or, alternatively, may be substantially undoped, depending on the design specifications of the device.

It is noted that the reference of "p-" and "p++" in FIG. 1 for upper region 24 and lower regions 22, respectively, as well as the n-type and p-type references noted in subsequently formed regions of the semiconductor topography in FIGS. 2-5 are merely used to illustrate exemplary relative net dopant concentration variations among the regions of the semiconductor topography and are not to be implied to refer to a specific range of net dopant concentrations. In addition, as noted above for semiconductor substrate 20, for example, the conductivity type of the regions having such references may be reversed in some embodiments. As such, although FIGS. 1-5 illustrate an embodiment in which an n-type photodiode is formed within a p-type substrate, it will be appreciated that other embodiments are possible without departing from the spirit and scope of the invention. In particular, a p-type photodiode may be formed within an n-type substrate using the description included herein. The term "net concentration of dopants," as used herein, may generally refer to the concentration of electrically active dopants within a region, disregarding concentrations of n-type and p-type dopants which have been essentially rendered inactive by canceling each other's charges. Alternatively stated, the term "net concentration of dopants" may refer to a concentration of dopants within a region that does not have a sufficient amount of dopants of opposite conductivity type to counterbalance their charge.

In general, semiconductor substrate 20 may be made of semiconductor materials. For example, semiconductor substrate 20 may, in some embodiments, be made of silicon, or more specifically, monocrystalline silicon or silicon-germanium. In other embodiments, semiconductor substrate may include gallium arsenide, indium antimonide, indium arsenide, lead selenide or lead sulfide. In any case, upper region 24 may, in some embodiments, be a doped portion of the substrate or may be an epitaxial layer grown from the substrate comprising lower region 22. In yet other embodiments, lower region 22 may include a silicon epitaxial layer arranged upon an interlevel dielectric, forming a silicon-on-insulator (SOI) base, and upper region 24 may, in some embodiments, be an epitaxial layer grown from the SOI base.

In either case, the thickness and net dopant concentration of upper region 24 may depend on the design specifications of the ensuing device and, therefore, may vary among applications. An exemplary thickness for upper region 24, however, may be between approximately 1 micron and approximately 10 microns. In addition, an exemplary net dopant concentration for upper region 24 may be between approximately $1 \times 10^{15}$ ions/cm$^3$ and approximately $1 \times 10^{17}$ ions/cm$^3$. Larger or smaller thicknesses and/or net dopant concentrations may be produced for upper region 24, depending on the design specifications of the device. In other embodiments, semiconductor substrate 20 may not include upper region 24. In any case, an exemplary net dopant concentration for lower region 22 may be between approximately $1 \times 10^{15}$ ions/cm$^3$ and approximately $1 \times 10^{19}$ ions/cm$^3$. Larger or smaller thicknesses and/or net concentrations, however, may be employed for lower region 22, depending on the design specifications of the device.

Figure 2:
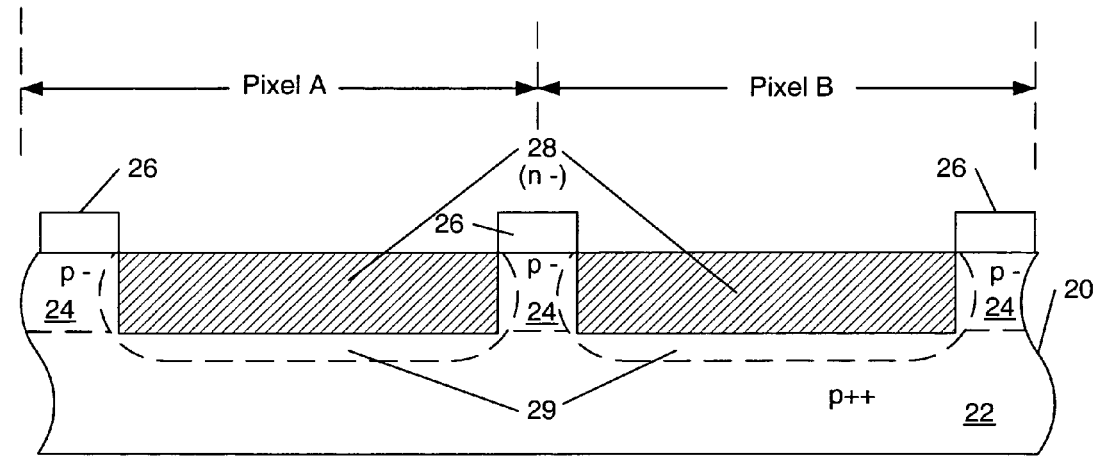
FIG. 2 is a partial cross-sectional view of the exemplary semiconductor substrate depicted in FIG. 1 subsequent to the formation of well regions within the substrate's upper surface.

Turning to FIG. 2, masking structures 26 may be patterned upon semiconductor substrate 20 to form well regions 28 within upper region 24 and/or within lower region 22. In particular, masking structures 26 may be formed by lithography techniques known in the art of semiconductor fabrication and may serve to protect underlying portions of upper region 24 and/or lower region 22 from the dopant implantation used to form well regions 28. As shown in FIG. 2, well regions 28 may be formed to have a net concentration of n-type dopants when upper region 24 and/or lower region 22 include p-type dopants to form a p-n diode. Alternatively, well regions 28 may be formed to have a net concentration of p-type dopants when upper region 24 and/or lower region 22 include n-type dopants to form an n-p diode. In either case, the implantation of dopants of opposite conductivity type to the substrate material forms depletion regions 29, which are essentially devoid of electrical charges.

In general, the ensuing photodiode pixel sensor is configured to collect charge carriers from electron-hole pairs absorbed into the topography to produce a photocurrent or photovoltage. As will be described in more detail below, the thickness of depletion regions 29 may contribute to the collection efficiency of the photodiode and, therefore, the process of collecting charge carriers by the ensuing photodiode pixel sensor is discussed now. In general, when light is absorbed within the ensuing pixel sensor, an electron-hole pair is formed. The electron-hole pair may be absorbed into any portion of the semiconductor topography, including well regions 28, depletion regions 29, portions of semiconductor substrate 20 surrounding depletion regions 29, as well as portions of a barrier material subsequently formed above well regions 28.

Any electron-hole pairs absorbed into well regions 28 are immediately separated to carriers of opposing conductivity types due to a drift field created by the subsequently formed succession of connected doped well regions and subsequently formed collection junction. Such a drift field causes the electrons to pass to the collection junction and causes the holes pass to portions of the topography surrounding well regions 28. Similarly, any electron-hole pairs absorbed into depletion regions 29 are swept across the junction and are immediately separated to opposing conductivity regions by the innate electrical potential of the depletion region. In particular, the holes pass to the portions of the topography surrounding depletion regions 29 and the electrons pass to well regions 28. Through the benefit of the drift field created by the subsequently formed succession of connected doped well regions, the electrons are then swept into a subsequently formed collection junction. Since depletion regions 29 and well regions 28 are used to separate charge carriers of light-induced electron-hole pairs into regions of opposite conductivity type, well regions 28 and depletion regions 29 may be collectively referred to as the generation regions of the photodiode.

As will be described in more detail below, the ensuing photodiode may also be configured to collect electrons separated from electron-hole pairs absorbed into portions of semiconductor substrate 20 surrounding depletion regions 29, as well as portions of a barrier material subsequently formed above well regions 28. In particular, electron-hole pairs absorbed within a diffusion length of depletion regions 29 may be swept into the depletion regions, separate, and be collected by the subsequently formed collection junction by means of the aforementioned drift field.

Since depletion regions 29 are apt to immediately separate any absorbed electron-hole pairs and, consequently, pass electrons to the collection junction, increasing the thickness of depletion regions 29 with which to capture and separate the photon generated electron-hole pairs may, in some embodiments, be advantageous for increasing collection efficiency. In general, the thickness of the depletion regions 29 is generally dependent on the doping concentrations of well regions 28 as well as the doping concentrations of upper region 24 and/or lower portion 22. In some embodiments, however, the thickness of depletion regions 29 may be increased during the operation of the pixel sensors. For example, a reverse-bias may be applied to the pixel sensor to increase the thickness of depletion regions 29. In yet other embodiments, the pixel sensor may be operated without the application of a reverse-bias. As such, it is noted that the photodiode described herein is not restricted to embodiments in which depletion regions are increased by the application of a reverse-bias, but rather may be configured in some embodiments for such an application as described below.

As shown in FIG. 2, well regions 28 may be formed within distinct areas of semiconductor substrate 20, referred to as pixel A and B. In particular, the pixel sensors described herein may be particularly useful in devices having a plurality of adjoining pixel sensors, such as an imaging array for example. In general, pixels A and B formed from semiconductor substrate 20 may be governed by the size of the ensuing photodiode and, in some cases, the size of active semiconductor devices formed therewith. More specifically, the areal dimensions of well regions 28 and resulting depletions regions 29 may be configured to extend across a majority of the pixel region in which they are formed such that collection efficiency may be increased. In particular, having well regions 28 and depletion regions 29 extending substantially across a majority of a pixel area, and in some embodiments nearly the complete pixel area, exposes photons to a greater area in which to be separated and collected. As a result, a greater number of charge carriers may be gathered to produce a photocurrent or photovoltage for the pixel sensor relative to photodiode pixel sensors of the same size which do not include a generation region extending across a majority area of the pixel sensor. As noted above, the thickness of depletion regions 29 may, in some embodiments, be increased by reverse-biasing the pixel sensor and, therefore, well regions 28 may, in some embodiments, be fabricated with dimensions which take into account whether such a reverse bias will be employed for the ensuing device.

While the dimensions of well regions 28 and resulting depletions regions 29 are preferably configured to extend across a majority of the pixel region to increase the collection efficiency of a pixel sensor, they are preferably configured such that depletion regions 29 do not overlap with well regions or depletion regions of neighboring pixels within a device, such as an imaging array, for example. In this manner, cross-collection of charge carriers between pixels may be prevented. In some embodiments, well regions 28 may be dimensionally configured such that depletion regions 29 within neighboring pixels are separated from an edge of a pixel area. In this manner, well regions 28 and resulting depletion regions 29 may be dimensionally configured such that portions of upper region 24 isolate the pixel area from neighboring pixel areas.

For example, well regions 28 may, in some embodiments, be dimensionally configured such that depletion regions 29 within neighboring pixels are separated by distances less than approximately 2.0 microns and, in some embodiments, less than approximately 1.0 micron or even less than approximately 0.5 microns. For instance, in a device including a plurality of pixels arranged at a pitch of 7.5×7.5 microns, well regions 28 may include areal dimensions between approximately 4.0×4.0 microns and approximately 6.0×6.0 microns. The lower dimensions of such a range may be particularly applicable in embodiments in which a reverse bias is applied to increase the thicknesses of the depletion regions. In particular, the lower areal dimensions may be sufficient for allowing the depletion regions to expand within the boundaries of the pixel area. Conversely, the upper dimensions of such a range may be applicable for embodiments in which a depletion region is not enlarged during the operation of the photodiode. It is noted that larger or smaller areal dimensions than the range noted above may be applicable for well regions 28, depending on the size of the pixel, doping concentrations of the junctions within the pixel sensor, the intended operation of the pixel sensor (i.e., whether a reverse bias will be applied), as well as several other factors. Consequently, the aforementioned values are merely exemplary. It is further noted that the boundaries of pixels A and B denoted by the dotted lines in FIG. 2 may be arbitrary and, therefore, are not restricted to such positions. The size of pixels A and B, however, are generally substantially equal.

As with upper region 24 and lower region 22, the thickness and net dopant concentration of well regions 28 may depend on the design specifications of the ensuing device and, therefore, may vary among applications. An exemplary net dopant concentration for well regions 28, however, may be between approximately $1\times10^{14}$ ions/cm$^3$ and approximately $1\times10^{17}$ ions/cm$^3$. An exemplary thickness for well regions 28 may, in some embodiments, be substantially similar to upper region 24 when included in the topography. Consequently, in some cases, well regions 28 may be fabricated to a depth between approximately 1 micron and approximately 10 microns. Larger or smaller thicknesses, however, may be produced for well regions 28, depending on the design specifications of the device. For example, in some cases, well regions 28 may be fabricated to a shallower or deeper depth than upper region 24. In some cases, it may be advantageous for well regions 28 to be dimensionally configured such that the well regions and/or resulting depletion regions 29 extend to the interface between upper region 24 and lower region 22. In particular, such a configuration may advantageously inhibit electrons from traversing through portions of upper region 24 prior to being swept into well regions 28, reducing the likelihood of the electrons recombining into the substrate and/or being swept into a depletion region of a neighboring pixel. More specifically, the widths of remaining portions of upper region 24 may be restricted, increasing the collection efficiency of the photodiode and the isolation of the pixel area.

Figure 3:
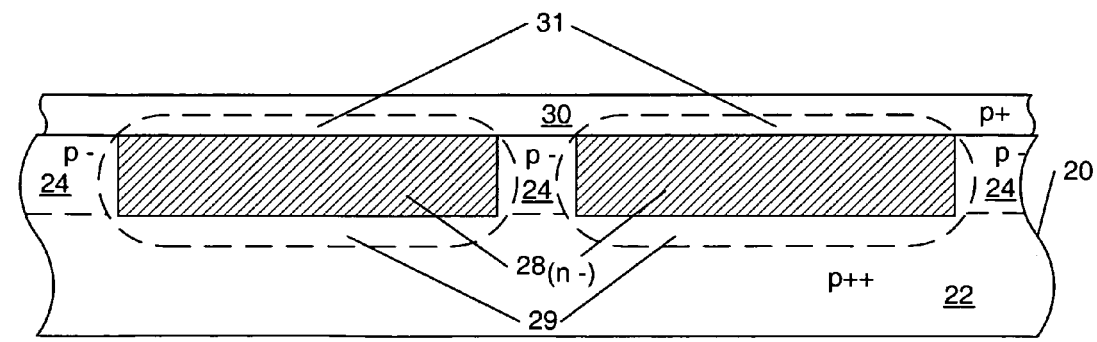
FIG. 3 is a partial cross-sectional view of a semiconductor topography including a barrier material formed upon the exemplary semiconductor substrate depicted in FIG. 2.

Subsequent to the formation of well regions 28, masking structures 26 may be removed and a barrier or spacer material may be subsequently formed upon semiconductor substrate 20 as shown in FIG. 3. The removal of masking structures 26 may be accomplished by a stripping technique such as a wet etch process, a downstream plasma etch process or a reactive ion etch process. As shown in FIG. 3, barrier material 30 may be formed upon the upper surfaces of well regions 28 and remaining portions of upper region 24, effectively isolating such regions from the upper surface of the topography. As such, well regions 28 will be hereinafter referred to as buried regions. As shown in FIG. 3, barrier material 30 may be of the same conductivity type as upper region 24 and lower region 22 and, therefore, may be formed of the opposite conductivity type as well regions 28. As a consequence, the formation of barrier material 30 upon well regions 28 may form depletion regions 31, which will serve to collect and separate electron-hole pairs in a similar manner as described above in reference to depletion regions 29.

In general, barrier material 30 may be a doped epitaxial layer formed to any thickness in accordance with the design specifications of the device. In some embodiments, it may be particularly advantageous to form barrier material 30 to a sufficient thickness such that in embodiments in which the thickness of depletion regions 31 are increased by the application of a reverse bias, the depletion regions do not extend into the interface of the barrier material 30 with subsequently formed overlying layers or structures, such as those included in active semiconductor devices. In this manner, barrier material 30 may serve to isolate buried well regions 28 or, more specifically, depletion regions 31 from overlying active semiconductor devices. More specifically, barrier material 30 separates depletion regions 31 from parasitic junctions which may be formed of the same conductivity type as well regions 28 at the surface of barrier material 30 for the fabrication of active semiconductor devices. As a consequence, the collection of charge into such parasitic junctions may be reduced.

In addition, the separation of buried well regions 28 or, more specifically, depletion regions 31 from the upper surface of barrier layer 30 may reduce dark current within the pixel sensor. As noted above, dark current is in part due to surface generation leakage current as well as the generation of carriers in the depletion region of a diode in the absence of light. By spacing depletion regions 31 apart from the surface of barrier layer 30, less surface generation leakage may enter depletion regions 31 and, consequently, dark current may substantially decrease. In some embodiments, it may be further advantageous for depletion regions 31 to be spaced apart from isolation regions (i.e., field oxide regions) subsequently formed within the upper surface of barrier layer 30, since the interface of such regions with the barrier material are particularly susceptible to leakage current due to the disruption of the crystalline structure of barrier layer 30 at such interfaces.

An exemplary thickness range for barrier layer 30 to insure isolation of depletion regions 31 from the surface of barrier layer 30 and field oxide regions formed therein may be between approximately 1 micron and approximately 10 microns. Larger or smaller thicknesses, however, may be employed for barrier layer 30, depending on the design specifications of the device. As shown in FIG. 3, the net concentration of dopants within barrier material 30 may be greater than upper region 24, enfolding upper region 24 between regions within relatively higher net concentrations of dopants. Such an arrangement creates electrostatic barriers at the interfaces of upper region 24 with barrier material 30 and lower region 22, respectively, which allows photon generated electron-hole pairs to remain within upper region 24 and be easily swept into depletion regions 29 and 31 for collection by the ensuing photodiode. In particular, the electrostatic interface barriers tend to reflect photon-generated electrons such that they remain within the boundaries of upper region 24. This architecture also allows a small diode to collect a relatively large amount of charge with a relatively high fill factor. As noted above, however, upper region 24 may be omitted in some cases and, therefore, the photodiode described herein is not necessarily restricted to such an architecture.

Figure 4:
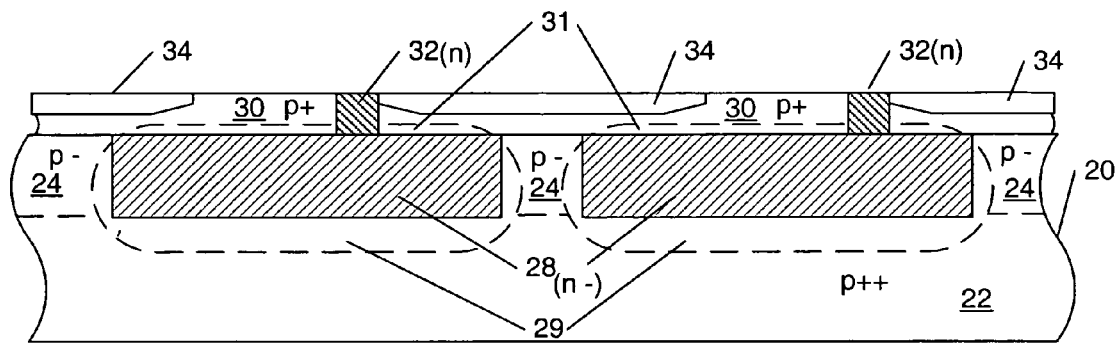
FIG. 4 is a partial cross-sectional view of the semiconductor topography depicted in FIG. 3 subsequent to the formation of field oxide regions and well regions within the upper surface of the barrier material.

Turning to FIG. 4, field oxide regions 34 may be formed within barrier material 30 to define device regions upon which active semiconductor devices may be formed. In addition, well regions 32 may be formed within the device regions extending through barrier material 30 to at least the upper surface of buried well regions 28 and, in some embodiments, into buried well regions 28 to electrically contact the buried well regions. As such, well regions 32 may be formed to a thickness equal to or greater than the thickness of barrier material 30. The thickness of field oxide regions 34 are shown to approximately the mid-depth of barrier material 30, but such a thickness is exemplary. In particular, field oxide regions 34 may be formed to any depth within barrier material 30, which is sufficiently spaced from depletion regions 31. In general, field oxide regions 34 and well regions 32 may be formed by the use of lithography masking structures formed upon the semiconductor topography and it is noted that the sequence of forming field oxide regions 34 and well regions 32 may be reversed in some embodiments.

As shown in FIG. 4, well regions 32 may be of the same conductivity type as buried well regions 28, but with a higher net concentration of dopants than buried well regions 28. For instance, well regions 32 may be formed with a concentration of dopants between approximately $1 \times 10^{15}$ ions/cm$^3$ and approximately $1 \times 10^{17}$ ions/cm$^3$. Larger or smaller net concentrations of dopants, however, may be employed for well regions 32, depending on the design specifications of the device. As will be described in more detail below, the relatively larger net concentration of dopants within well regions 32 will aid in channeling photon-generated charge carriers introduced into buried well regions 28 to a subsequently formed collection-junction.

Figure 5:
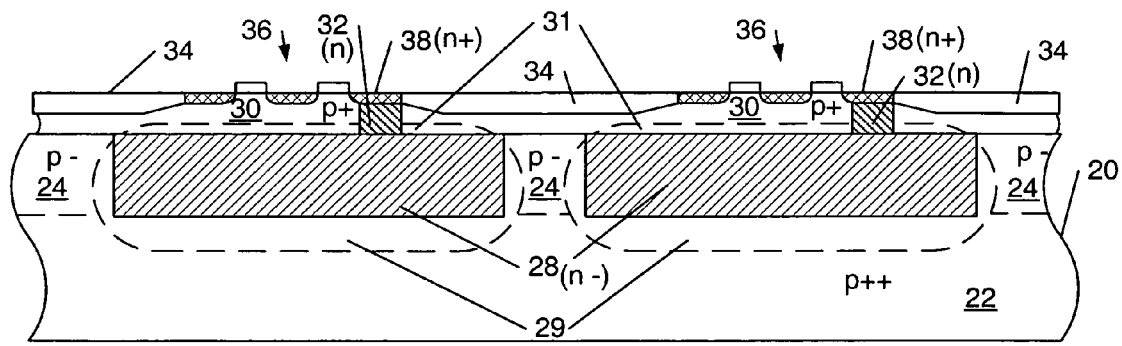
FIG. 5 is a partial cross-sectional view of the semiconductor topography depicted in FIG. 4 subsequent to the formation of device structures between the isolation regions and collection-junctions within the well regions of the barrier material.

Subsequent to the formation of well regions 32 and field oxide regions 34, device structures 36 may be formed within the device regions of the semiconductor topography as shown in FIG. 5. In particular, FIG. 5 illustrates the formation of devices structures 36 above the photodiode produced by the succession of interlocking junctions of the same conductivity type, namely buried well regions 28, well regions 32 and collection-junctions 38 of device structures 36. Arranging device structures 36 above the photodiode may advantageously decrease the size of the pixel area relative to conventional photodiode pixel sensors which have device structures formed above portions of a semiconductor substrate adjacent to the photodiode. As shown in FIG. 5, device structures may include transistors in some embodiments. In particular, device structures 36 may include row or column select transistors to select an output of the pixel or reset transistors to reset the pixel. In some cases, device structures 36 may include NMOS transistors. In other embodiments, device structures 36 may include PMOS transistors. In any case, drain regions of the transistors of the same conductivity type as well regions 32 and buried well regions 28 may serve as collection junctions 38 of the photodiode as shown in FIG. 5. Although FIG. 5 specifically illustrates device structures 36 as transistors, device structures 36 may include other structures which may be used to amplify charge that is collected in the collection junctions of the photodiode. Consequently, devices structures 36 may include collection-junctions other than drain regions of transistors to collect charge produced by the photodiode of the topography.

As shown in FIG. 5, collection-junctions 38 may be formed at least partially into well regions 32 to make electrical contact thereto. In addition, collection-junctions 38 are formed of the same conductivity type as buried well regions 28 and well regions 32 with a higher net concentration of dopants than buried well regions 32. For example, collection-junctions 38 may be formed with a concentration of dopants between approximately $1\times10^{18}$ ions/cm$^3$ and approximately $1\times10^{20}$ ions/cm$^3$. Larger or smaller net concentrations of dopants, however, may be employed for collection-junctions 38, depending on the design specifications of the device. In any case, such a configuration of junctions having successively increasing net concentrations of dopants may produce a photodiode having a built-in potential which generates a drift field that causes substantially all carriers collected in buried well regions 28 and well regions 32 to be channeled or funneled into collection-junctions 38. As described in more detail below, although each of the diode junctions (i.e., buried well regions 28 in upper region 24, well regions 32 in barrier material 30, and collection junctions 38 in barrier material 30) can collect charge, the dominant collection of charge carrier from the separation of electron-hole pairs is in buried well regions 28.

In general, the photodiode pixel sensors described herein may convert a wider range of light frequencies than conventional photodiode pixel sensors. In particular, the photodiode described herein is specifically configured to absorb and convert light into charge carriers at the surface of the pixel sensor as well as levels spaced below the surface of the pixel sensor. In general, low frequencies of light, such as infrared light, are more likely to be absorbed deeper into a substrate relative to higher frequencies of light. As such, low frequency light may be absorbed into buried well regions 28, depletion regions 29 and remaining portions of upper regions 24. In addition, high frequency light may be absorbed into barrier material 30 such that photon generated electron-hole pairs may traverse to depletion regions 31. As noted above, the electron-hole pairs separate within the depletion regions and buried well regions 28 and the appropriate charge carriers are channeled through well regions 32 into collection-junctions 38 to produce a photocurrent or photovoltage.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A photodiode pixel sensor, comprising:
a buried well region of a first conductivity type formed within a portion of a semiconductor substrate of a second conductivity type opposite to the first conductivity type;
a well region of the first conductivity type arranged upon and in contact with an upper surface of the buried well region, wherein the well region comprises a first net concentration of dopants greater than a second net concentration of dopants within the buried well region;
a collection-junction of the first conductivity type in electrical contact with the well region, wherein the collection-junction comprises a third net concentration of dopants greater than the first net concentration of dopants within the well region; and
a barrier material of the second conductivity type arranged over a majority of an upper surface of the buried well region and surrounding the well region and collection-junction on multiple sides; wherein the buried well region, the well region and the collection-junction form a series of three vertically positioned junctions having successively increasing net concentration of dopants from the semiconductor substrate.

2. The photodiode pixel sensor of claim 1, wherein the collection-junction comprises a drain region of a transistor spaced directly above the buried well region.

3. The photodiode pixel sensor of claim 1, wherein at least one of the lateral boundaries of the buried well region is arranged inward from at least one of the lateral boundaries of the photodiode pixel sensor by a distance of less than 2.0 microns.

4. The photodiode pixel sensor of claim 1, wherein a built-in potential among the buried well region, the well region and the collection-junction generates a drift field that causes substantially all carriers generated within the buried well region to be collected into the collection junction.

5. The photodiode pixel sensor of claim 1, wherein the first conductivity-type is n-type.

6. The photodiode pixel sensor of claim 1, wherein the first conductivity-type is p-type.

7. A photodiode pixel sensor, comprising:
a transistor comprising a drain region of a first conductivity type;
a first well region of the first conductivity type extending downward from a lower surface of the drain region through a barrier material of a second conductivity type, opposite from the first conductivity type, the barrier material surrounding the first well region on multiple sides; and
a second well region of the first conductivity type arranged in contact with a lower surface of the first well region and spaced directly below at least a portion of the transistor by the barrier material;
wherein a first net concentration of dopants within the drain region is greater than a second net concentration of dopants within the first well region, and wherein the second net concentration of dopants within the first well region is greater than a third net concentration of dopants within the second well region, and wherein the drain region, the first well region and the second well region form a series of three vertically positioned junctions having successively decreasing net concentration of dopants from and including the drain region of the transistor.

8. The photodiode pixel sensor of claim 7, wherein at least one of the lateral boundaries of the second well region is arranged inward from at least one of the lateral boundaries of the photodiode pixel sensor by a distance of less than 2.0 microns.

9. The photodiode pixel sensor of claim 7, wherein the second well region is a retrograde well region.

10. The photodiode pixel sensor of claim 7, wherein the second well region comprises a substantially uniform concentration of dopants.

11. The photodiode pixel sensor of claim 7, wherein the second well region is arranged within an upper portion of a second conductivity type semiconductor substrate, and wherein the upper portion of the semiconductor substrate comprises a first net concentration of dopants less than a second net concentration of dopants within the barrier material.

12. The photodiode pixel sensor of claim 11, wherein the first net concentration of dopants within the upper portion of the semiconductor substrate is less than a third net concentration of dopants within a lower portion of the semiconductor substrate.

13. The photodiode pixel sensor of claim 12, wherein the second well region extends between upper surfaces of the upper and lower portions of the semiconductor substrate.

14. A photodiode pixel sensor, comprising:
a collection-junction of a first conductivity type comprising a surface portion of a semiconductor topography;
a well region of the first conductivity type extending downward from a lower surface of the collection-junction through a barrier material of a second conductivity type opposite from the first conductivity type, wherein the barrier material surrounds the well region and the collection junction on multiple sides, wherein a first net concentration of dopants within the collection-junction is greater than a second net concentration of dopants within the well region; and
a buried well region of the first conductivity type arranged in contact with a lower surface of the well region and spaced directly underneath at least a portion of the barrier material of the second conductivity type, wherein the second net concentration of dopants within the well region is greater than a third net concentration of dopants within the buried well region, and wherein the collection-junction, the well region, and the buried well region form a series of three vertically positioned junctions having successively decreasing net concentration of dopants from the surface portion of the semiconductor topography.

15. The photodiode pixel sensor of claim 14, wherein the barrier material is arranged over a majority of an upper surface of the buried well region and surrounds the well region and collection-junction.

16. The photodiode pixel sensor of claim 14, wherein the collection-junction comprises a dopant region of a semiconductor device structure, wherein the semiconductor device structure is configured to amplify charge collected in the collection-junction, and wherein the buried well region is spaced underneath at least a portion of the semiconductor device structure by the barrier material.

17. The photodiode pixel sensor of claim 16, wherein the buried well region is spaced underneath an entirety of the semiconductor device structure by the barrier material.

18. An imaging device comprising multiple photodiode pixel sensors formed within a semiconductor substrate, wherein each of the multiple photodiode pixel sensors comprises:
a semiconductor device comprising a collection-junction of a first conductivity type, wherein the semiconductor device is configured to amplify charge collected in the collection-junction;
a well region of the first conductivity type extending downward from a lower surface of the collection-junction through a barrier material of a second conductivity type opposite from the first conductivity type, wherein the barrier material surrounds the well region and the collection junction on multiple sides; and
a buried well region of the first conductivity type arranged in contact with a lower surface of the well region and spaced underneath an entirety of the semiconductor device by the barrier material, wherein the collection-junction, the well region, and the buried well region are arranged to form a series of three vertically positioned junctions having successively decreasing net concentration of dopants.

19. The imaging device of claim 18, wherein a first net concentration of dopants within the collection-junction is greater than a second net concentration of dopants within the well region, and wherein the second net concentration of dopants within the well region is greater than a third net concentration of dopants within the buried well region.

20. The imaging device of claim 18, wherein the barrier material is arranged over a majority of an upper surface of the buried well region and surrounds the well region and collection junction.

21. The imaging device of claim 18, wherein each of the multiple photodiode pixel sensors further comprises depletion regions surrounding the buried well regions, and wherein depletion regions of adjacent photodiode pixel sensors are isolated from each other by portions of the barrier material.

22. The imaging device of claim 18, wherein the depletion regions of adjacent photodiode pixel sensors are isolated from each other by less than approximately 2.0 microns.

* * * * *